United States Patent
Ives

(10) Patent No.: US 6,903,542 B2
(45) Date of Patent: Jun. 7, 2005

(54) SYSTEMS AND METHOD FOR PERFORMING RF POWER MEASUREMENTS

(75) Inventor: Fred Ives, Veradale, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 28 days.

(21) Appl. No.: 10/652,288

(22) Filed: Aug. 29, 2003

(65) Prior Publication Data

US 2005/0046409 A1 Mar. 3, 2005

(51) Int. Cl.[7] .............................................. G01R 27/00
(52) U.S. Cl. ...................................... 324/95; 455/127.1
(58) Field of Search ................ 324/95, 142; 455/67.11, 455/115.1, 127.1, 127.2

(56) References Cited

U.S. PATENT DOCUMENTS

| | | | |
|---|---|---|---|
| 5,656,929 A | 8/1997 | Humpherys | |
| 5,663,638 A | 9/1997 | Humpherys | |
| 5,835,850 A | * 11/1998 | Kumar | ..................... 455/67.14 |
| 6,242,901 B1 | 6/2001 | Faick et al. | |
| 6,291,984 B1 | 9/2001 | Wong et al. | |
| 6,534,966 B2 | * 3/2003 | Zou | ............................. 324/95 |

OTHER PUBLICATIONS

Holt, Tim, et al., "RF power measurement techniques for digital broadcast systems", Applied Technology, Feb. 2002, pp. 68–70.

* cited by examiner

*Primary Examiner*—Vinh Nguyen
*Assistant Examiner*—Russell M. Kobert

(57) ABSTRACT

In one embodiment, a radio frequency (RF) power meter operates according to a variable loop bandwidth according to the nature of the RF signal to be measured. The RF power meter comprises: a first switch that switchably provides one of a first signal and a second signal, wherein the first signal is the RF signal to be measured; a first signal path for detecting an output signal from the first switch and for providing a first comparison signal according to a first bandwidth, a second signal path for detecting an output from the first switch and for providing a second comparison signal according to a second bandwidth, and a second switch that switchably provides one of the first comparison signal and the second comparison signal to the first switch to complete a closed-loop for the RF power meter.

20 Claims, 2 Drawing Sheets

SYSTEMS AND METHOD FOR PERFORMING RF POWER MEASUREMENTS

TECHNICAL FIELD

Representative embodiments are directed to systems and methods for performing RF power measurements.

BACKGROUND

Measuring the radio frequency power associated with a wireless device is frequently necessary for production, final testing, repair, and other related activities. Typically, diode power meters and calorimetric power meters have been utilized to perform radio frequency power measurements associated with various cellular devices. Specifically, diode power meters are relatively well-suited to measure radio frequency power associated with continuous wave (CW) signals and other relatively narrow bandwidth signals (such as those signals associated with the AMPS standard). Calorimetric power meters are more suitable for broadband signals such as signals associated with code division multiple access (CDMA) signals.

An example of a diode power meter is shown in U.S. Pat. No. 5,656,929. The disclosed diode power meter switches a radio frequency (RF) detector between an input RF signal and a comparison RF signal to generate a difference signal. The difference signal is filtered, and converted into a direct current (DC) error signal by a synchronous detector that operates in step with the RF detector. The DC error signal is applied to an integrator to generate a loop control signal. The square of the loop control signal is linearly proportional to the input RF signal power when the servo loop is nulled, causing the comparison RF signal to equal the input RF signal.

A calorimetric power meter is a device that determines RF power utilizing, in general, a temperature-generated differential created by the signal being measured. An example of a calorimetric power meter is disclosed in U.S. Pat. No. 5,663,638. The disclosed calorimetric power meter accepts RF power into a terminating load that thermally couples generated heat to a temperature dependent resistance in one arm of a bridge. The imbalance created in the bridge produces an error signal within a servo loop. The servo loop responds by applying a direct current (DC) or low frequency power to a separate terminating load that couples heat into another arm of the bridge. The applied power is measured by metering how much power is required of the servo loop to re-balance the bridge. Calorimetric power meters are advantageous, because they measure total aggregate power contained in the signal. Thus, calorimetric power meters are suitable for wideband signals. However, calorimetric power meters suffer from certain limitations. Calorimetric power meters typically experience a relatively slow response time. Specifically, heat storage in the bridge limits the response time for the first power measurement, and after this measurement the bridge must be re-balanced by zeroing out the heat generated before a second measurement can be made. Accordingly, calorimetric power meters typically are unsuitable for wideband, non-repetitively pulsed signals such as occur in wide CDMA formats used for data applications.

SUMMARY

Representative embodiments are directed to systems and methods for measuring RF power. Representative embodiments provide a single power meter that enables RF power measurements to be performed for both narrowband and wideband signals. In representative embodiments, variable loop bandwidth may be selected according to the nature of the signal being measured. For example, a first portion of the RF power meter may provide a wideband loop that facilitates measurement of the power associated with modulation bandwidths from CW signals up to signals with 1.23 MHz modulation bandwidth, such as IS-95 CDMA signals. A second portion of the RF power meter may provide a narrowband loop to facilitate the measurement of the power associated with wide modulation bandwidth signals such as cdma2000 and WCDMA signals. In the United States, wideband CDMA is deployed under the cdma2000 Standards and, in Europe and internationally, wideband CDMA is deployed under the 3GPP Standards. Present modulation bandwidths are up to 3.84 MHz within these standards. By implementing first and second loop portions in this manner, representative embodiments enable RF power measurements to be performed for a variety of signal formats utilizing a single RF power meter.

Moreover, in representative embodiments, a detector block is operated within the transition region from linear to square law region when the wideband loop is selected and another detector block is operated only within a square law region when the narrowband loop is selected. By enabling detection within the square law region, the detector operates in a manner similar to a calorimetric detection but will respond much more quickly. The diode based square law detector will not require time for heat storage to balance out or heat re-balancing after the first measurement as is typical for calorimetric detection.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated that the conception and specific embodiment disclosed may be readily utilized as a basis for modifying or designing other structures for carrying out the same purposes of the present invention. It should also be realized that such equivalent constructions do not depart from the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION

Figure 1:
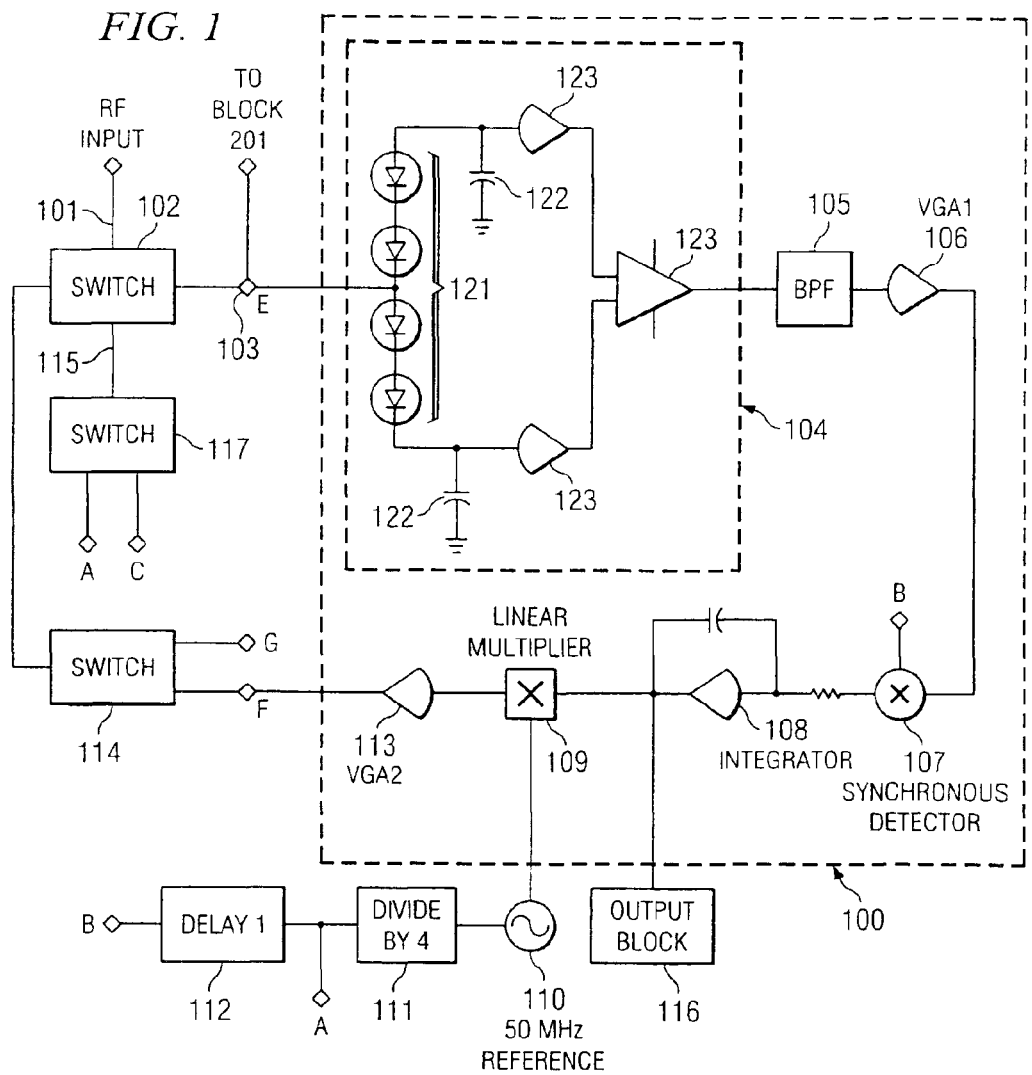
FIGS. 1 and 2 depict respective portions of an RF power meter that may operate according to variable bandwidth according to representative embodiments.
Figure 2:
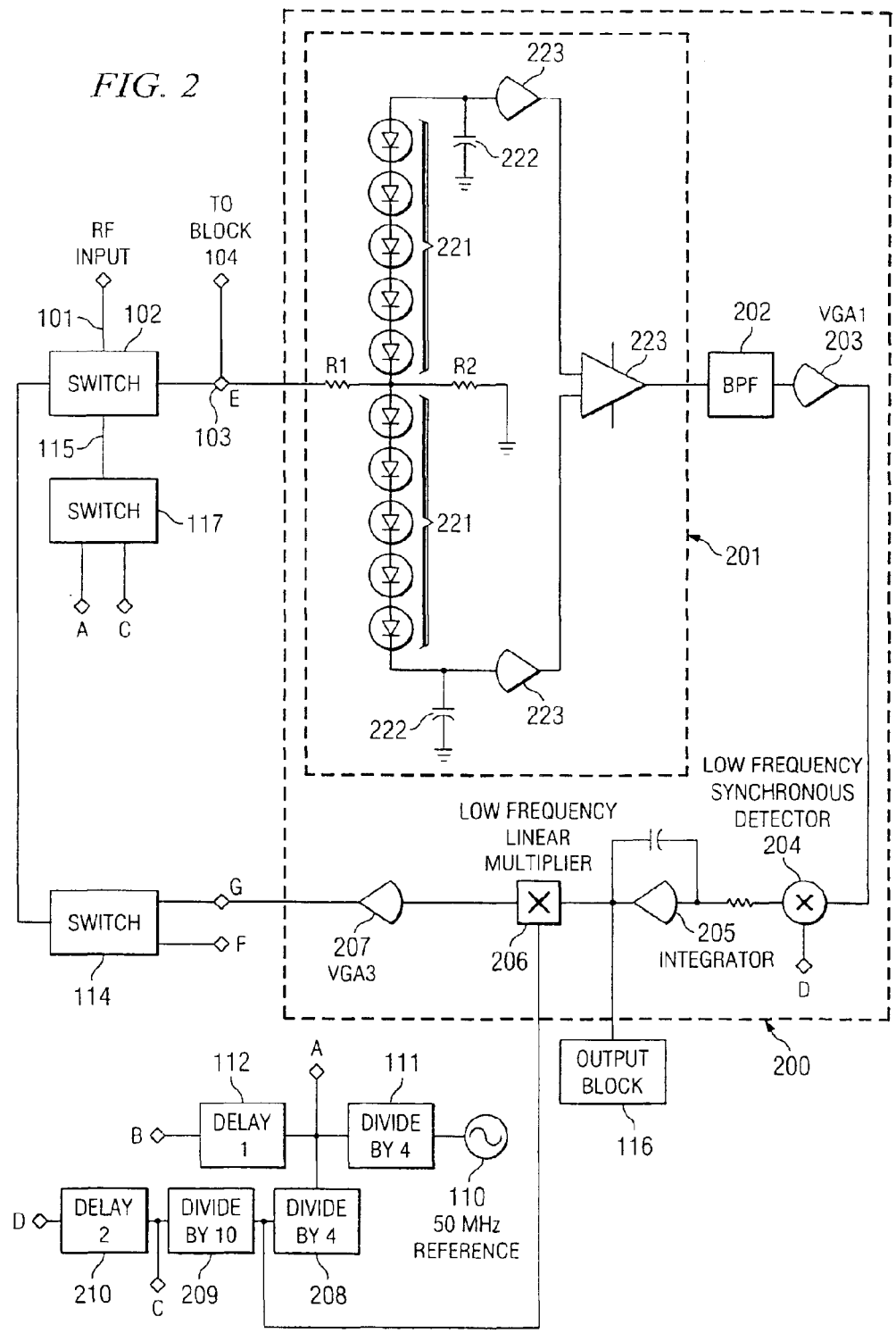

Referring now to the drawings, FIGS. 1 and 2 depict respective portions of an RF power meter that may operate according to variable bandwidth according to representative embodiments. For example, the RF power meter may be operated in multiple modes. In one of the modes, the RF power meter operates according to a closed loop bandwidth that is relatively wide and is suitable for measuring the power of relatively narrowband signals (e.g., from CW signals to signals having modulation bandwidths up to 1.23 MHz). In another of the modes, the RF power meter operates according to a closed loop bandwidth that is relatively narrow and is suitable for measuring the power of relatively wideband signals that possess relatively wide dynamic range. Examples of these signals include cdma2000 and WCDMA signals with modulation bandwidths of 3.84 MHz.

FIG. 1 depicts signal path 100 that completes a closed loop according to a relatively wide bandwidth of an RF power meter according to representative embodiments. As shown in FIG. 1, switch 102 switches between RF input line 101 that receives an RF signal to be measured and line 114 that provides a comparison signal from a closed loop as will be discussed in greater detail below. As controlled by the operation of switch 102, the servo loop obtains a sample of the input RF signal and compares that sample to the comparison or feedback signal.

Switch 102 is controlled by a signal present at node A or node C depending upon the mode of operation of the RF meter via the operations of switch 117. One of signal path 100 and signal path 200 (shown in FIG. 2 and to be discussed below) receives the output signal from RF connection 102 via, for example, another RF connection (shown as RF connection 103 at point E in FIG. 1). Signal path 100 provides a signal path to complete the closed loop for feedback to switch 102 according to the mode associated with a relatively wide bandwidth. Accordingly, by operating RF connection 103 to provide the respective signals to signal path 100, the power of relatively narrowband RF signals may be measured efficiently.

Signal path 100 begins with detector block 104. Detector block 104 includes diode stacks 121 arranged in an antiparallel manner. An example of a diode stack implementation is discussed in greater detail in U.S. Pat. No. 6,242,901, which is incorporated herein by reference. Diode stacks 121 are terminated by capacitors 122. The time constants of capacitors 122 are selected to allow the incoming RF signal to be tracked inside the loop bandwidth with no slewing at the detector 104 output. Furthermore, detector block 104 may be implemented as a differential diode detector utilizing a plurality of operational-amplifiers 123.

Detector block 104 may be adapted to operate diode stacks 121 within a linear region, a transition region, and a square law region. Specifically, as is well-known, the current versus voltage equation for an ideal diode is given by: $I=I_0(e^{(nV/kT)}-1)$, where I represents the diode current, V represents the diode voltage, T represents the diode temperature, and $I_0$, n, and k are constants. Over a limited range of voltages, this equation may be approximated by: $I=a(V^2)$, where a is a constant. The range of voltages where this approximation holds is referred to as the square law region. In another limited range of voltages (referred to as the linear region), the diode equation may be approximated by a linear relationship between the diode current and the diode voltage. Also, a range of voltages exist between the linear region and the square law region which is referred to as the transition region. A major advantage of the high bandwidth closed loop design is the attendant large gain of the loop. This feature enables the closed loop detector output to closely follow the RF signal for narrowband, pulsed, and signals with modulation bandwidths up to, for example, 1.5 MHz.

Bandpass filter 105 filters the output from detector block 104 to obtain information centered around the switching frequency of switch 102. The output from bandpass filter 105 is amplified by variable gain amplifier 106. The amplified signal is provided to synchronous detector 107 which is controlled by the signal present on node B. Specifically, the signal present on node B is a delayed version of the signal present on node A (as delayed by element 112). The amount of delay provided by delay element 112 is selected to equal the amount of delay associated with detector block 104, bandpass filter 105, and variable gain amplifier 106.

Synchronous detector 107 generates a direct current (DC) or low frequency error signal that may be utilized to null the servo loop thereby causing the voltage of the comparison signal to approximate or equal the voltage of the RF signal being measured. That is, synchronous detector 107 generates a signal that is indicative of or related to the difference in voltage between the comparison signal and the signal being measured (i.e., the signal received via line 101). Synchronous detector 107 may be implemented in a number of ways. For example, synchronous detector 107 may be implemented to include a switch (not shown) and a differential amplifier (not shown). The signal from amplifier 106 could be provided to alternate inputs of the differential amplifier using the switch as controlled by the signal present on node B as disclosed in U.S. Pat. No. 5,656,929, which is incorporated herein by reference.

The error signal generated by synchronous detector 107 is provided to integrator 108. Because of the wide loop bandwidth and large loop gain the voltage associated with the output of integrator 108 is linearly proportional to the voltage of the signal being measured. Accordingly, the output of integrator 108 is provided to output block 116 that utilizes the linear relationship defined by closed loop signal path 100 to provide the user with information indicative of the voltage and/or power of the signal being measured. Also, the integrated error signal is utilized as a loop control signal. Specifically, the output of the integrated error signal is provided to linear multiplier 109 (e.g., a suitable analog multiplier) that is coupled to 50 MHz reference oscillator 110 as an example. The output of multiplier 109 is provided to variable gain amplifier 113. Switch 114, when operated in the mode to cause the closed loop to be defined by signal path 100, causes the signal present at node F to be provided to switch 102. Specifically, the output of variable gain amplifier 113 is provided to switch 102 thereby completing the closed loop.

Additionally, variable gain amplifiers 106 and 113 may be utilized to adjust the loop gain associated with signal path 100 to enable the operation of diode detector block 104 in the square law, transition, or linear regions. By enabling operation of diode detector block within these regions, processor control of the loop gain may facilitate RF power measurement for signal formats having differing pulse, modulation, and peak value characteristics.

FIG. 2 depicts signal path 200 according to representative embodiments. Signal path 200 completes the closed loop for feedback to switch 102 according to a relatively narrow loop bandwidth. Detector block 201 receives the signal (either the signal being measured or the comparison signal) from switch 102 as discussed previously with respect to FIG. 1. Detector block 201 is adapted to operate diode stacks 221 within the square law region. This is partially accomplished by using a resistive divider (consisting of R1 and R2 in block 201) to attenuate the signal at RF connection 103 into detector block 201. Also multiple diodes (five in this example) are used in the diode stacks to further put the diodes into the square law operation region. By adapting detector block 201 in this manner, signal path 200 is suitable for measuring relatively wideband signals that possess a relatively wide dynamic range (such as wide CDMA formats adapted for data communication as well as voice communication). Because the loop bandwidth associated with detector block 201 is relatively narrow, capacitors 222 may possess a larger capacitance relative to capacitors 122 (shown in FIG. 1) and amplifiers 223 may possess a lower bandwidth relative to amplifiers 123 (shown in FIG. 1).

The output from detector block 201 is provided to bandpass filter 202. The filtered signal is provided to variable gain amplifier 203 which may be a relatively slower speed amplifier relative to amplifier 106 (shown previously in FIG. 1). The amplified signal is provided to lower frequency synchronous detector 204. Lower frequency synchronous detector 204 is driven by the signal present at node D. The signal present at node D is a delayed version of the signal present at node C. The delay provided by delay element 210 between nodes C and D is selected to approximate or equal the delay associated with detector block 201, filter 202, and amplifier 203. The output of synchronous detector 204 is provided to integrator 205.

Because detector block 201 is operated within the square law region, the voltage of the output of integrator 205 is related to the square root of the voltage of the signal being measured (i.e., the signal inputted into line 101 as shown in FIG. 1). Accordingly, the output of integrator 205 is provided to output block 116 that utilizes the square law relationship to provide the user with information indicative of the voltage and/or power of the signal being measured.

Additionally, the output of integrator 205 is utilized as a loop control signal. The output of integrator 205 is provided to lower frequency linear multiplier 206. The output of multiplier 206 is provided to variable gain amplifier 207. The loop may be closed by operating switch 114 to provide the output (the signal present at node G) from amplifier 207 to switch 102 (previously discussed in regard to FIG. 1).

Representative embodiments enable the user to define the loop bandwidth by adjusting the gain associated with variable gain amplifier 203 and/or variable gain amplifier 207. By varying the loop bandwidth, the performance of the RF meter may be optimized. Specifically, the variation in the loop bandwidth is useful for measuring signals with different pulse duty cycles. The variable loop bandwidth for the square law detector enables a trade off of loop response time versus the pulse duty cycle being measured thereby achieving a greater degree of accuracy for the measurement of time varying (pulsed) wideband CDMA signals.

Representative embodiments provide further advantages by omitting the necessity of re-balancing thermal bridges. Specifically, known thermal bridge power meters requires 10 milliseconds for sampling, 6 milliseconds for settling, and 26 milliseconds for re-balancing and re-zeroing the thermal bridge. Representative embodiments enable sampling to occur within 1 millisecond for narrowband signals and within 2 milliseconds for wideband signals. In further contrast to thermal bridge designs, representative embodiments do not require any time for re-balancing or re-zeroing.

By implementing signal paths 100 and 200 within a single RF power meter, various circuit components may be utilized for the multiple modes of operation. That is, the high frequency components of the power meter may be used for both loops, allowing for a more compact design and a lower cost of manufacturing. For example, as shown in FIG. 2, a frequency divider path may be utilized to provide frequency signals to control operation of the RF power meter according to variable bandwidths. As previously discussed, 50 MHz reference oscillator 110 and frequency divider 111 provide frequency signals (as present on nodes A and B) to control operations of the RF meter according to a relatively wideband loop. Frequency dividers 208 and 209 are coupled thereto to further divide the frequency reference to provide frequency signals (as present on nodes C and D) when the RF meter is operated in the mode of operation associated with the narrow loop bandwidth.

Furthermore, in representative embodiments, detector block 104 and detector block 201 may be integrated on a single dual detector block utilizing modern GaAs integrated circuit (IC) process techniques. By implementing detector block 104 and detector clock 201 in this manner, excellent matching of the diodes in the two detectors and an excellent RF frequency response may be obtained. Accordingly, the accuracy of the power measurement may be improved.

Although the present invention and its advantages have been described in detail, it should be understood that various changes, substitutions and alterations can be made herein without departing from the invention as defined by the appended claims. Moreover, the scope of the present application is not intended to be limited to the particular embodiments of the process, machine, manufacture, composition of matter, means, methods and steps described in the specification. As one will readily appreciate from the disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A radio frequency (RF) power meter, comprising:
   a first switch that switchably provides an output signal from one of a first signal and a second signal, wherein said first signal is an RF signal to be measured;
   a first signal processing path for detecting said output signal from said first switch and for providing a first comparison signal according to a first bandwidth;
   a second signal processing path for detecting said output signal from said first switch and for providing a second comparison signal according to a second bandwidth;
   a second switch that switchably provides said second signal from one of said first comparison signal and said second comparison signal to said first switch to complete a closed-loop for said RF power meter; and
   an output block for providing information indicative of the power of said RF signal to be measured utilizing one of respective integrated signals generated by said first signal processing path and said second signal processing path.

2. The RF meter of claim 1 further comprising:
   an oscillator for generating a frequency reference; and
   a frequency divider path that divides said frequency reference, wherein said first switch is controlled by a first frequency signal defined by said frequency divider path when said first signal processing path completes said closed-loop and said first switch is controlled by a second frequency signal defined by said frequency divider path when said second signal processing path completes said closed-loop.

3. The RF meter of claim 2 further comprising:
a first synchronous detector, in said first signal processing path, controlled by a delayed version of said first frequency signal; and
a second synchronous detector, in said second signal processing path, controlled by a delayed version of said second frequency signal.

4. The RF meter of claim 1 wherein each of said first signal processing path and said second signal processing path comprise a respective diode detector.

5. The RF meter of claim 4 wherein said second signal processing path operates its respective diode detector in a square law region.

6. The RF meter of claim 4 wherein each of said diode detectors comprise diode stacks are arranged in an anti-parallel configuration.

7. The RF meter of claim 1 wherein one of said first signal processing path and said second signal processing path includes a variable gain amplifier that adjusts a loop gain associated with said respective signal processing path.

8. A method for determining the power of a radio frequency (RF) signal, comprising:
receiving a selection of a loop bandwidth for measurement of the power of the RF signal;
switchably providing an output signal from one of a first signal and a second signal, wherein said first signal is said RF signal;
providing, according to said loop bandwidth, said output signal to one of a first signal processing path and a second signal processing path, wherein each of said first sand second signal processing paths generate a respective comparison signal;
providing a respective comparison signal from one of said first and second signal processing paths as said second signal to close a measurement loop for said RF signal; and
providing information indicative of the power of said RF signal utilizing one of respective integrated signals generated by said first and second signal processing paths.

9. The method of claim 8 further comprising:
receiving a frequency reference;
dividing said frequency reference along a frequency divider path; and
controlling said switchably providing according to a first frequency signal defined by said frequency divider path when said first signal processing path completes said measurement loop and according to a second frequency signal defined by said frequency divider path when said second signal processing path completes said measurement loop.

10. The method of claim 9 further comprising:
controlling a first synchronous detector, in said first signal processing path, by a delayed version of said first frequency signal; and
controlling a second synchronous detector, in said second signal processing path, by a delayed version of said second frequency signal.

11. The method of claim 8, further comprising:
operating a diode detector block in said second signal processing path in a square region.

12. The method of claim 11, wherein said diode detector block comprises diode stacks arranged in an anti-parallel configuration.

13. The method of claim 8 further comprising:
adjusting a loop gain associated one of said first and second signal processing paths by adjusting a gain of a variable gain amplifier.

14. A radio frequency (RF) power meter, comprising:
a first switch means for switching between a first signal and a second signal to provide an output signal, wherein said first signal is an RF signal to be measured;
a first signal processing path means for detecting and processing said output signal from said first switch means to generate a first comparison signal according to a first bandwidth;
a second signal processing path means for detecting and processing said output signal from said first switch means to generate a second comparison signal according to a second bandwidth; and
a second switch means for switching between said first comparison signal and said second comparison signal to provide said second signal to said first switch means to complete a closed-loop for said RF power meter.

15. The RF power meter of claim 14 further comprising:
an output means for providing information indicative of the power of said RF signal.

16. The RF meter of claim 14 further comprising:
an oscillator means for generating a frequency reference; and
a frequency divider means for dividing said frequency reference in multiple stages, wherein said first switch means is controlled by a first frequency signal defined by said frequency divider means when said first signal processing path means completes said closed-loop and said first switch means is controlled by a second frequency signal defined by said frequency divider means when said second signal processing path means completes said closed-loop.

17. The RF meter of claim 16 further comprising:
first means, in said first signal processing path means, for synchronously detecting that is controlled by a delayed version of said first frequency signal; and
second means, in said second signal processing path means, for synchronously detecting that is controlled by a delayed version of said second frequency signal.

18. The RF meter of claim 14 where each of said first and second signal processing path means comprise a respective diode detector.

19. The RF meter of claim 18 wherein each of said diode detectors comprise diode stacks are arranged in an anti-parallel configuration.

20. The RF meter of claim 14 wherein one of said first and second signal processing path means comprises an adjustable means for amplifying to adjust a loop gain associated with said respective signal path means.

* * * * *

UNITED STATES PATENT AND TRADEMARK OFFICE
CERTIFICATE OF CORRECTION

PATENT NO. : 6,903,542 B2
DATED : June 7, 2005
INVENTOR(S) : Ives

It is certified that error appears in the above-identified patent and that said Letters Patent is hereby corrected as shown below:

Title page,
Item [54], Title, delete "METHOD" and insert -- METHODS --.

Column 7,
Line 33, delete "sand" and insert -- and --.

Column 8,
Line 50, delete "where" and insert -- wherein --.

Signed and Sealed this

Twenty-first Day of March, 2006

JON W. DUDAS
*Director of the United States Patent and Trademark Office*